United States Patent
Kobayashi (10) Patent No.: US 7,443,096 B2
(45) Date of Patent: Oct. 28, 2008

(54) ORGANIC ELECTROLUMINESCENT DEVICE, METHOD OF MANUFACTURING THE SAME, AND ELECTRONIC APPARATUS

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 262 days.

(21) Appl. No.: 11/026,068

(22) Filed: Jan. 3, 2005

(65) Prior Publication Data
US 2005/0184654 A1    Aug. 25, 2005

(30) Foreign Application Priority Data
Feb. 19, 2004  (JP) ............... 2004-043026

(51) Int. Cl.
*H01L 21/00* (2006.01)
*H01J 63/04* (2006.01)
*H01J 1/62* (2006.01)
*H01J 9/00* (2006.01)

(52) U.S. Cl. ................. 313/504; 445/24; 445/25; 438/33; 438/34; 313/498; 313/505; 313/506; 313/503

(58) Field of Classification Search ............ None
See application file for complete search history.

(56) References Cited

U.S. PATENT DOCUMENTS

| | | | |
|---|---|---|---|
| 5,106,197 A * | 4/1992 | Ohuchida et al. | 349/73 |
| 5,472,889 A | 12/1995 | Kim et al. | |
| 6,610,554 B2 * | 8/2003 | Yi et al. | 427/289 |
| 6,972,746 B1 | 12/2005 | Takayama et al. | |
| 7,298,357 B2 | 11/2007 | Takayama et al. | |
| 2003/0173891 A1 | 9/2003 | Chiba et al. | |

FOREIGN PATENT DOCUMENTS

| | | |
|---|---|---|
| JP | A-61-77884 | 4/1986 |
| JP | A 05-188401 | 7/1993 |
| JP | A 07-295484 | 11/1995 |
| JP | A-08129360 | 5/1996 |
| JP | A 2001-092389 | 4/2001 |
| JP | A 2002-372928 | 12/2002 |
| JP | A-2003-173165 | 6/2003 |
| JP | A 2003-216072 | 7/2003 |

* cited by examiner

*Primary Examiner*—Natalie K Walford
(74) *Attorney, Agent, or Firm*—Oliff & Berridge, PLC (57) ABSTRACT

An organic electroluminescent (EL) device reduces or suppresses display irregularities and enhances or improves display characteristics, when a large-sized organic EL device is formed by bonding small EL substrates to a large-sized substrate. Exemplary embodiments include a method of manufacturing an electronic apparatus including the organic EL device. The organic EL device has organic EL elements R, G and B, each having electrodes opposite to each other, a functional layer between the electrodes, a light emitting layer; and driving elements to drive the organic EL elements. Small substrates on each of which the organic EL elements R, G, and B and driving elements are formed are connected in a surface direction, such that a large-sized substrate is formed. At least one type of wiring lines for respective driving elements formed on the small EL substrates; and corresponding wiring lines in connected small EL substrates are electrically connected by a conductive material.

11 Claims, 5 Drawing Sheets

ORGANIC ELECTROLUMINESCENT DEVICE, METHOD OF MANUFACTURING THE SAME, AND ELECTRONIC APPARATUS

BACKGROUND

Exemplary embodiments relate to a large-sized organic electroluminescence (EL) device formed by bonding small EL substrates to a large-sized substrate, a method of manufacturing the same, and an electronic apparatus.

In the related art, an organic electroluminescent device (hereinafter, referred to as "organic EL") has organic EL elements as self-luminous elements without needing a backlight.

The respective organic EL elements have an organic EL layer, that is, a light emitting layer between a pair of electrodes opposite to each other. In particular, when performing full color display, the organic EL elements have organic EL layers (light emitting layers), each having a light emitting wavelength band corresponding to each color of red (R), green (G), and blue (B) and emitting each color.

There is a demand for a large-sized screen with regard to a display and an organic electroluminescent device. However, in the case in which the large-sized screen in the organic EL device includes a single display panel, there are many problems associated with mechanical strengthness or with manufacture. Thus, mass-production of the large-sized screen in the organic EL device with a single display panel, to date, is not available.

Therefore, a method in which an organic EL element portion is unitized and is plurally arranged in a tile shape is effective. Here, the organic EL device is constructed such that an organic EL element is plurally formed on a substrate to form the organic EL element portion, and lead electrodes are provided to supply display signals and scanning signals from a driving circuit to an anode and a cathode in the organic EL element. Moreover, the organic EL device is relatively suitable for unitization since its device structure is relatively simple.

However, in the case in which the organic EL element portion unitized in such a manner is arranged in a tile shape to form a large-sized display, it is important to make a joining portion point) between adjacent units inconspicuous. The joint is conspicuous because a non-display portion (a portion in which a pixel is not formed) having a width wider than a pixel pitch of the unit exists. Specifically, even though the non-display portion does not exist, light is reflected or refracted in the joint, and thus the joint becomes conspicuous.

Therefore, in the related art, in order to reduce or prevent the joint from being conspicuous due to the reflection or refraction of light, a diffraction grating is used (for example, see Japanese Unexamined Patent Application Publication No. 2001-92389.

Figure 7:
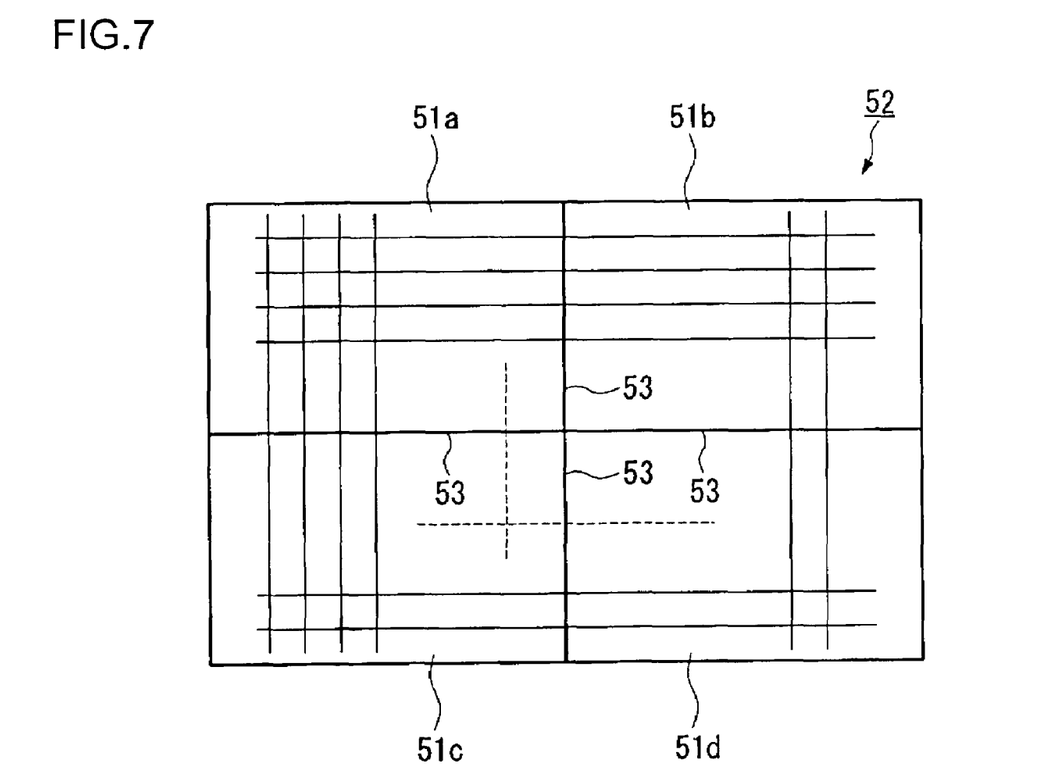
FIG. 7 is a schematic showing a wiring line structure of a related art organic EL device in an exemplary embodiment of the present invention.

SUMMARY

Where the unitized organic EL element portions are arranged in a tile shape to form the large-sized display as described above, wiring lines are formed separately for every unit. For example, as shown in FIG. 7, in the case of a large-sized display 52 in which four units 51a, 51b, 51c, and 51d are arranged in multiple directions, the respective units 51a, 51b, 51c, and 51d are constructed such that an electrode portion of a driving circuit is provided at the position of an outer circumference portion of the large-sized display and wiring lines are formed toward the inside of the large-sized display, that is, the joining portion between the units, whereby the drives of the respective organic EL elements are controlled.

However, if the wiring lines are formed separately in the respective units 51a, 51b, 51c, and 51d and the drives (light emitting operation) of the respective units are controlled, in the inside, that is, pixel portions (organic EL elements) in the vicinities of the joining portions (joints) 53 between the units, potential inclination is generated due to wiring line resistance. Thus, when displaying, display in the inside becomes dark as compared with the side of an outer circumference portion, and thus display irregularity is caused. Then, a degree of such display irregularity is different between the respective units 51a, 51b, 51c, and 51d, and thus display irregularity becomes remarkable in the joining portions (joints) 53 between adjacent units, in particular, among the units 51a, 51b, 51c, and 51d, which results in greatly damaging display performance. That is, when display irregularity is generated consecutively, it is difficult to meet the eye of an observer. On the other side, when display irregularity (display difference) is generated inconsecutively in the joining portion (joint) 53, it easily meets the eye of the observer.

Exemplary embodiments address the above and/or other problems, and provide an electro-optical device which, in the case in which small EL substrates are joined on a large-sized substrate to form a large-sized organic EL device, can reduce or suppress display irregularity in joining portions and enhance or improve display performance, a manufacturing method of the same, and an electronic apparatus having the organic EL device.

In order to address or attain the above, exemplary embodiments provide an organic EL device having electrodes opposite to each other, organic EL elements provided between the electrodes, each organic EL element having a functional layer having at least a light emitting layer, and driving elements for driving the organic EL elements, in which a plurality of small EL substrates, on each of which the organic EL elements and the driving elements are formed, are connected to each other in their surface direction to form a large-sized EL substrate. In at least one kind of wiring lines among wiring lines of the driving elements formed on the respective small EL substrates, corresponding wiring lines between the connected small EL substrates are electrically connected to each other by a conductive material. In this exemplary embodiment, in this organic EL device, the corresponding wiring lines in the small EL substrates are electrically connected to each other by means of the conductive material. Therefore, even when potential inclination is generated by means of wiring line resistance and thus display irregularity is generated, display irregularity is just consecutively generated by means of potential inclination. Further, even in the joining portions (joints) between the small EL substrates, display irregularity (display difference) is just generated consecutively, not inconsecutively. Therefore, since display irregularity (display difference) almost never meets the eye of an observer, display characteristics are enhanced or improved.

In an exemplary embodiment, in the organic EL device, in power lines among the wiring lines of the driving elements formed on the respective small EL substrates, corresponding wiring lines between the connected small EL substrates are electrically connected to each other by the conductive material. In this exemplary embodiment, since the wiring lines of the power lines influencing display performance are electrically connected to each other by the conductive material, display irregularity (display difference) is more reduced, minimized or suppressed. Thus, display performance is enhanced or improved more.

In an exemplary embodiment, in the organic EL device, in scanning lines or signal lines among the wiring lines of the driving elements formed on the respective small EL substrates, corresponding wiring lines between the connected small EL substrates are electrically connected to each other by the conductive material. In this exemplary embodiment, since the wiring lines of the scanning lines or the signal lines influencing display performance are connected to each other by the conductive material, display irregularity (display difference) is suppressed and thus reduced, minimized or eliminated. Thus, display performance is improved.

In an exemplary embodiment, in the organic EL device, a connecting portion between the wiring lines at which the conductive material is provided is positioned just below a partition portion for dividing a pixel region in which the functional layer is formed. In this exemplary embodiment, the connecting portion extends over the pixel region, and thus damage to display characteristics in the pixel region is reduced, minimized or eliminated.

In an exemplary embodiment, in the organic EL device, an insulating material is formed on the conductive material to cover the conductive material. In this exemplary embodiment, it is possible to discourage or prevent other conductive portions from being electrically shorted on the conductive material.

In an exemplary embodiment, in the organic EL device, bank portions made of an insulating material are formed at both sides of the position at which the conductive material is formed on the wiring lines connected by the conductive material. In this exemplary embodiment, for example, in the case in which the conductive material is selectively arranged by the liquid droplet ejection method, it becomes possible to discourage or prevent the conductive material from flowing in both sides of each of the wiring lines, from being penetrated into the joints between the small EL substrates by means of capillary phenomenon, and from causing electrical short to other conductive portions. Further, it becomes possible to discourage or prevent the conductive material from being insufficiently loaded between the wiring lines.

In an exemplary embodiment, a method of manufacturing an organic EL device in which a plurality of small EL substrates are connected to each other in their surface direction to form a large-sized EL substrate is provided. Each small EL substrate has electrodes opposite to each other, organic EL elements provided between the electrodes, each organic EL element having a functional layer having at least a light emitting layer, and driving elements to drive the organic EL elements. The method includes: exposing end portions of at least one kind of wiring lines among wiring lines of the driving elements formed on the respective small EL substrates; connecting the small EL substrates to each other such that the exposed end portions are opposite to each other; and arranging a conductive material between the end portions of the opposing wiring lines to electrically connect the wiring lines to each other by the conductive material. In this exemplary embodiment, in the method of manufacturing an organic EL device, the corresponding wiring lines between the small EL substrates are electrically connected to each other by the conductive material. Thus, in the resultant organic EL device, as described above, even in the joining portions (joints) between the small EL substrates, display irregularity (display difference) is consecutively generated, not inconsecutively generated. Therefore, since display irregularity (display difference) almost never meets the eye of an observer, display characteristics of the organic EL device can be enhanced or improved.

In an exemplary embodiment, in the method of manufacturing an organic EL device, the conductive material is arranged between the end portions of the wiring lines by a liquid droplet ejection method. In doing so, it becomes possible to arrange the conductive material in a predetermined amount at a desired position.

In an exemplary embodiment, in the method of manufacturing an organic EL device, preferably, after arranging the conductive material between the end portions of the wiring lines to electrically connect the wiring lines to each other by the conductive material, an insulating material is provided on the conductive material to cover the conductive material by the liquid droplet ejection method. In doing so, by providing the insulating material, it becomes possible to discourage or prevent other wiring lines from being electrically shorted on the conductive material. Further, by adopting the liquid droplet ejection method, it becomes possible to easily arrange the insulating material in a predetermined amount at a desired position.

In an exemplary embodiment, in the method of manufacturing an organic EL device, preferably, after connecting the small EL substrates to each other such that exposed end portions of power lines are opposite to each other, and before arranging the conductive material between the opposing end portions of the wiring lines, an insulating material is arranged at both sides of the position at which the conductive material is formed on the wiring lines to be connected by a liquid droplet ejection method to form bank portions made of the insulating material. In doing so, it becomes possible to discourage or prevent the conductive material from flowing in both sides of the position at which the conductive material is arranged, from being penetrated into the joints between the small EL substrates by capillary phenomenon, and from causing electrical short to other conductive portions. Further, it becomes possible to discourage or prevent the conductive material from being insufficiently loaded between the wiring lines.

In an exemplary embodiment, an electronic apparatus has the organic EL device described above or an organic EL device manufactured by the manufacturing method described above. In this exemplary embodiment, since this electronic apparatus has the organic EL device having enhanced or improved display characteristics, by using the organic EL device as a display unit, display characteristics of the electronic apparatus itself are enhanced or improved.

DETAILED DESCRIPTION OF EMBODIMENTS

Figure 1:
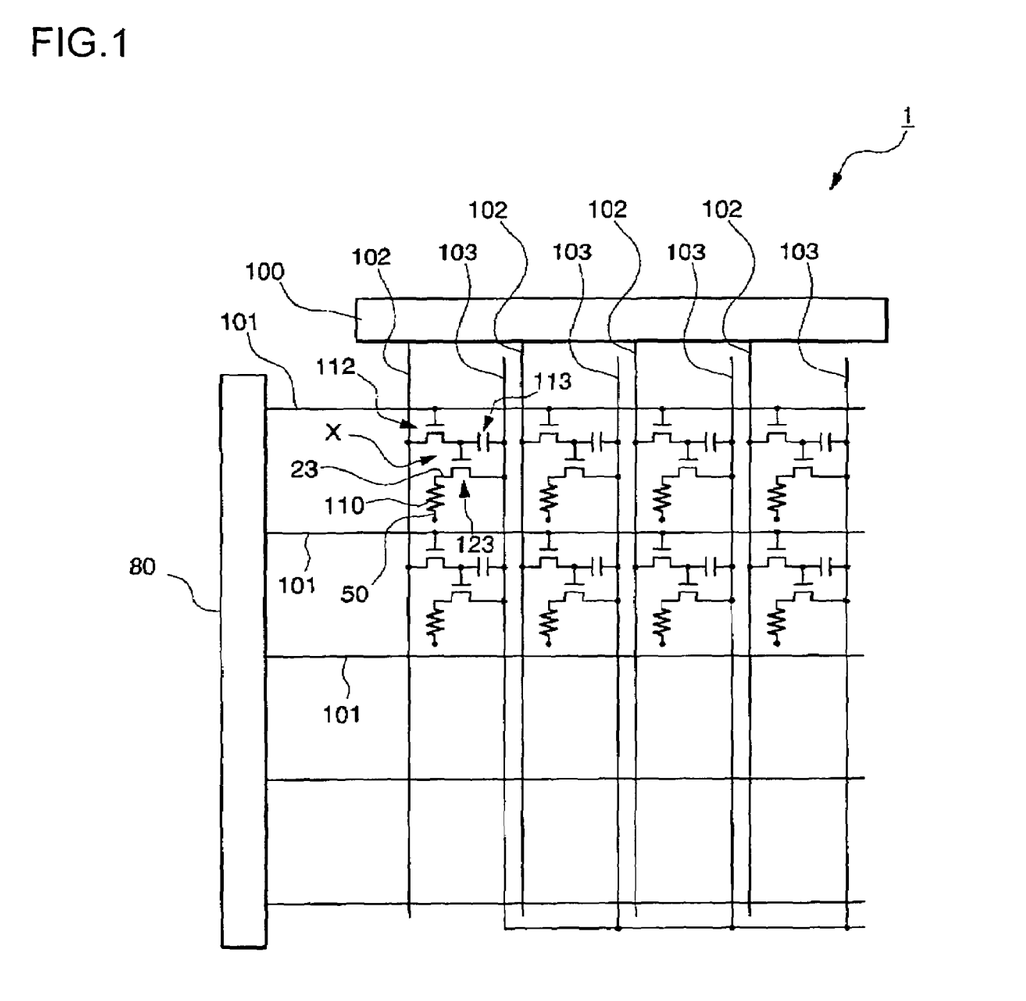
FIG. 1 is a schematic showing a wiring line structure of an organic EL device in an exemplary embodiment of the present invention.

Hereinafter, exemplary embodiments of the present invention will be described in detail. In a first exemplary embodiment, an organic EL device is a large-sized organic EL device in which a plurality of small EL substrates are connected to each other in their surface direction on a mother substrate. In such a manner, in the organic EL device of the present invention in which the plurality of small EL substrates are joined to each other, a wiring line structure is constructed, as shown in FIG. 1. Moreover, FIG. 1 is a schematic showing a portion of the wiring line structure of an organic EL device of an exemplary embodiment, that is, a wiring line structure of significant parts of the small EL substrate. In FIG. 1, reference numeral "1" denotes the organic EL device.

The organic EL device 1 is an active matrix type organic EL device in which a thin film transistor (hereinafter, referred to as "TFT") may be used as a switching element. Thus, the organic EL device 1 has a plurality of scanning lines (selecting lines) 101, a plurality of signal lines 102 extending in a direction orthogonal to the respective scanning lines 101, a plurality of power lines 103 extending parallel to the respective signal lines 102, and pixel regions X in the vicinities of intersections of the scanning lines 101 and the signal lines 102.

A data line driving circuit 100, having shift registers, level shifters, video lines, and analog switches, is connected to the signal lines 102. A scanning line driving circuit 80, having shift registers and level shifters, is connected to the scanning lines 101.

Each pixel region X may have a switching TFT 112 of which a gate electrode is supplied with a scanning signal via the scanning line 101, a storage capacitor 113 for storing a pixel signal supplied from the signal line 102 via the switching TFT 112, a driving TFT 123 of which a gate electrode is supplied with the pixel signal stored in the storage capacitor 113, a pixel electrode (electrode) 23 into which a driving current flows from the power line 103 when electrically connected to the power line 103 via the driving TFT 123, and a functional layer 110 interposed between the pixel electrode 23 and a cathode (electrode) 50. The pixel electrode 23, the cathode 50, and the functional layer 110 constitute a light emitting element, that is, an organic EL element. Moreover, in an exemplary embodiment of the present invention, the driving element may be composed of the switching TFT 112 and the driving TFT 123.

In this exemplary embodiment, according to the organic EL device 1 having such a construction, if the scanning line 101 is driven and the switching TFT 112 is turned on, the potential of the signal line 102 at that time is stored in the storage capacitor 113. In addition, depending on a state of the storage capacitance 113, an on or off state of the driving TFT 123 is determined. A current flows from the power line 103 into the pixel electrode 23 via a channel of the driving TFT 123, and the current flows into the cathode 50 via the functional layer 110. Then, the functional layer 110 emits light depending on the amount of current flowing therethrough.

Next, a specified aspect of the electro-optical device 1 of the present exemplary embodiment will be described with reference to FIGS. 2 and 3. Moreover, FIG. 2 is a plan view schematically showing a construction of the organic EL device 1, and FIG. 3 is an enlarged cross-sectional schematic of significant parts in a surface parallel to the line C-D of FIG. 2.

Figure 2:
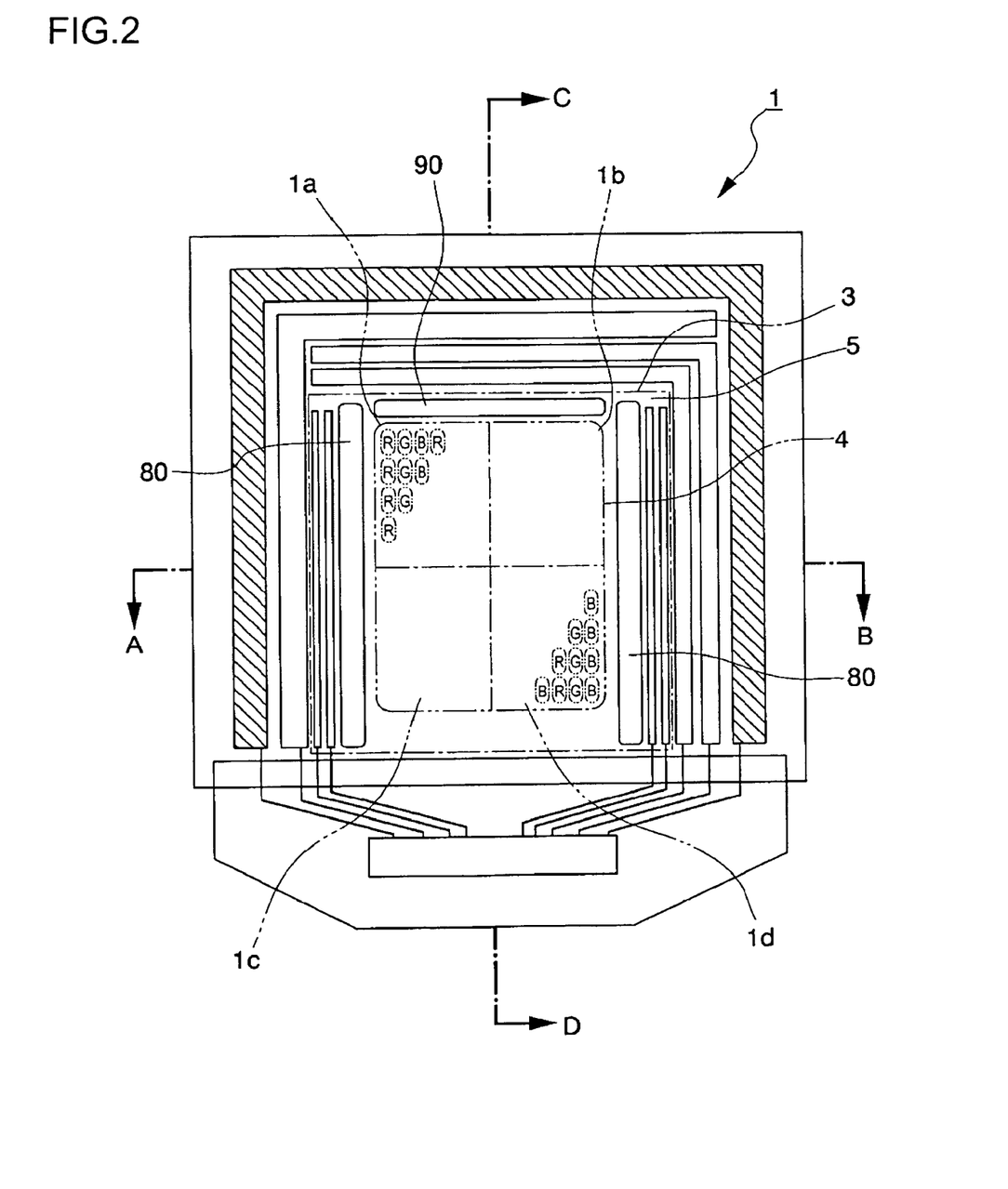
FIG. 2 is a schematic plan view showing a construction of an organic EL device in an exemplary embodiment of the present invention.
Figure 3:
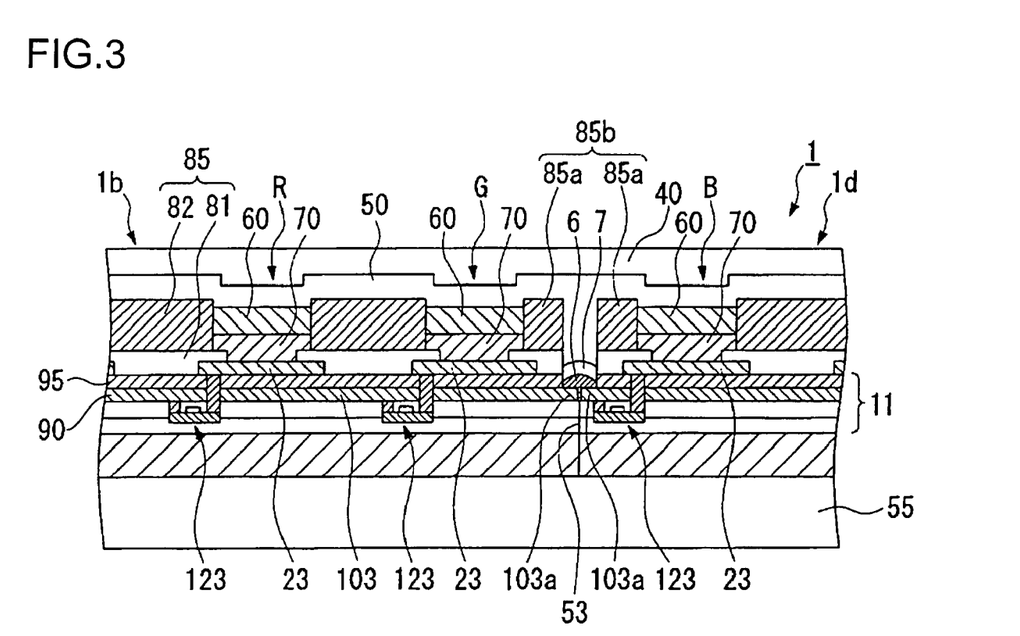
FIG. 3 is a schematic of an enlarged cross-sectional view of significant parts in a surface parallel to the line C-D of FIG. 2 in an exemplary embodiment of the present invention.

In an exemplary embodiment of the organic EL device 1 is a large-sized organic EL device in which a plurality (in the present embodiment, four small EL substrates) of small EL substrates 1a, 1b, 1c, and 1d, as shown in FIG. 2 may be bonded on a mother substrate 55, as shown in FIG. 3. That is, in the present exemplary embodiment, four rectangular small EL substrates 1a, 1b, 1c, and 1d may be arranged in vertical and horizontal directions, in particular, so as to divide an actual display region 4 into four parts and are bonded on the mother substrate 55. Moreover, in FIG. 2, lines A-B and C-D represent joining portions of the four small EL substrates 1a, 1b, 1c, and 1d.

As shown in FIG. 2, the organic EL device 1 of the present exemplary embodiment has the mother substrate (not shown) having light transmittance and electrical insulation, such as glass, a substrate on the mother substrate and similarly having light transmittance and electrical insulation, a pixel electrode region (not shown) in which the pixel electrodes connected to the switching TFTs (not shown) are arranged in a matrix, the power lines (not shown) arranged around the pixel electrode region and connected to the respective pixel electrodes, and a pixel portion 3 (in FIG. 2, within a dash-dot line box) being positioned on at least the pixel electrode region and having substantially a rectangular shape in plan view. Moreover, in the present exemplary embodiment, the pixel portion 3 is divided into the actual display region 4 (in FIG. 2, within a dash-dot-dot line box) of a central portion and a dummy region 5 (a region between the one-dot chain line and the two-dot chain line) arranged in the vicinity of the actual display region 4.

In the actual display region 4, display regions R, G, and B each having the pixel electrode are arranged regularly in the directions of the lines A-B and C-D. At both sides of the actual display region 4, in FIG. 2, the scanning line driving circuits 80 may be arranged. The scanning line driving circuits 80 may be positioned below the dummy region 5.

On an upper side of the actual display region 4, in FIG. 2, a test circuit 90 is arranged, and the test circuit 90 is provided on the lower layer side of the dummy region 5. The test circuit 90 is a circuit to test operating conditions of the organic EL device 1. For example, the test circuit 90 has a test information output device (not shown) to output test results to the outside. The test circuit 90 is constructed to test the quality and defects of a display device during manufacture or at the time of shipment.

Driving voltages of the scanning line driving circuits 80 and the test circuit 90 are applied from a predetermined power supply unit via driving voltage connecting portions (not shown). Further, driving control signals and driving voltages are transmitted and applied from a predetermined main driver to control the operation of the organic EL device 1 to the scanning line driving circuits 80 and the test circuit 90 via driving control signal connecting portions (not shown) and the driving voltage connecting portions (not shown). Moreover, in this case, the driving control signals are instruction signals related to controls at the time when the scanning line driving circuits 80 and the test circuit 90 output signals.

In an exemplary embodiment, as shown in FIG. 3, the organic EL device 1 has a large-sized EL substrate formed by holding and fixing the small EL substrates 1a, 1b, 1c, and 1d (in FIG. 3, only the small EL substrates 1a and 1b are shown) onto the mother substrate 55 by means of adhesion. That is, the small EL substrates 1a, 1b, 1c, and 1d are connected to each other via the mother substrate 55 to form a large-sized EL substrate, such that the large-sized organic EL device 1 is constructed.

In an exemplary embodiment in each of the small EL substrates 1a to 1d, the driving elements or the organic EL elements are formed on the substrate. With a bottom-emission type organic EL device, since light is emitted from the side of the substrate, a transparent or translucent substrate is adopted as the substrate. For example, glass, quartz, resin (plastic or a plastic film) or the like is exemplified, and, in particular, a glass substrate is suitably used. In the present exemplary embodiment, the bottom-emission type organic EL device in which emitted light is taken out from the side of the substrate is prepared, and thus a transparent or translucent substrate is used as the substrate.

In an exemplary embodiment, with a top-emission type organic EL device, since emitted light is taken out from the side opposite to the substrate 20, a transparent substrate or a nontransparent substrate can be used. As the nontransparent substrate, thermosetting resin, thermoplastic resin or the like is exemplified, as well as a substrate in which an insulation treatment, such as surface oxidation, is performed on ceramic, such as alumina, a metallic sheet, such as stainless steel, or the like.

On the substrate 20, a circuit portion 11 having the driving TFTs 123 to drive the pixel electrodes 23, and so on, is formed. Here, source lines of the driving TFTs 123 are formed by the power lines 103. The power lines 103 are formed such that end portions 103a at the sides of the joining portions, through which the respective substrates are joined, extend up to the joining end surfaces of the respective substrates (in FIG. 3, the joining portions (joints) 53 between the substrates) and further are exposed on the substrate. And then, as described below, the respective substrate 1a to 1d (in FIG. 3 1b and 1d are shown) are arranged on the mother substrate 55 such that the end portions 103a of respective power lines 103, to be connected together among the end portions 103a of the respective power lines 103 of the respective substrates 1b and 1d, are opposite to each other and are shoved against each other. Subsequently, on the jointing portion between the connected end portions 103a and 103a, a conductive material 6 is provided. Based on this construction, the power lines 103 are constructed such that the corresponding end portions 103a between the respective small substrates 1a to 1d are electrically connected to each other by the conductive material 6.

Figure 4:
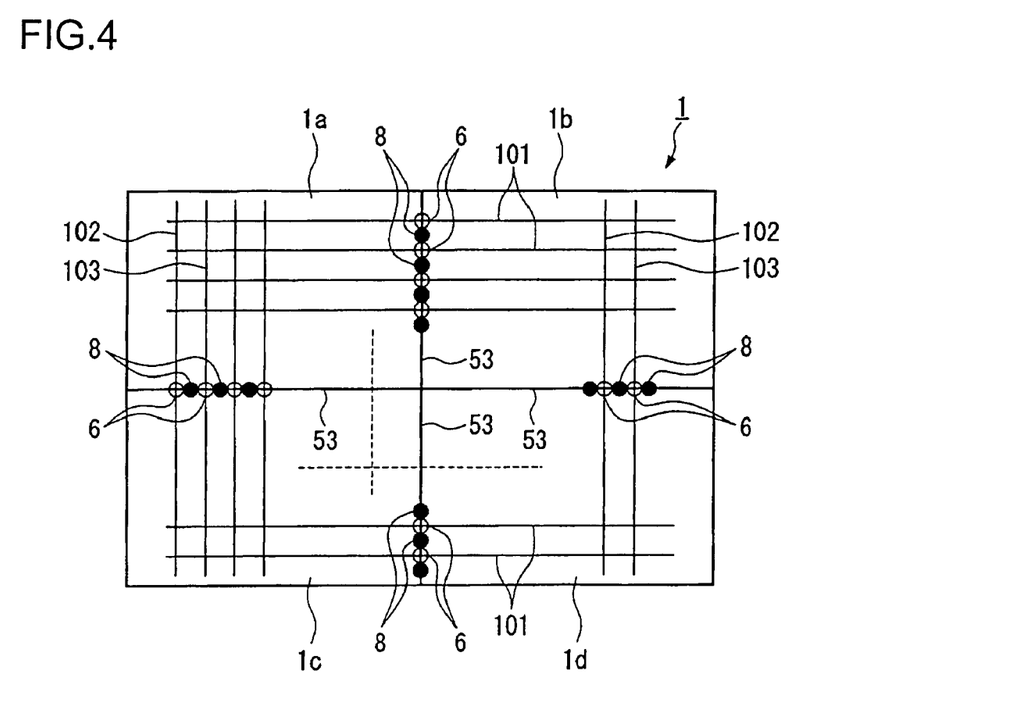
FIG. 4 is a schematic showing a state in which the respective wiring lines are connected to each other by a conductive material in an exemplary embodiment of the present invention.

In the present exemplary embodiment, similar to the power lines 103, the scanning lines 101 and the signal lines 102, other than the power lines 103, are electrically connected to each other in adjacent substrates of the respective small EL substrates 1a to 1d (not shown in FIG. 3). That is, as shown in FIG. 4, in the respective small EL substrates 1a to 1d, the respective end portions of the respective wiring lines (the power lines 103, the scanning lines 101, or the signal lines 102) in the respective joining portions (joints) 53 are electrically connected to each other by means of the conductive material 6. Moreover, on the conductive material 6, an insulating material 7, such as resin or an inorganic material, is provided to cover the conductive material 6. By this construction, the conductive material 6 is discouraged or prevented from being electrically shorted to other conductive portions (for example, the cathode 50).

In the respective wiring lines 101, 102, and 103, at both sides of the position at which the conductive material 6 is formed, that is, on the joining portion (joint) 53 between the substrates, a bank portion 8 made of an insulating material is provided. For example, as described below, in the case in which the conductive material 6 is selectively arranged with a liquid droplet ejection method, the bank portion 8 is intended to discourage or prevent the conductive material 6 from flowing in both sides of the wiring line, from being permeated into the respective joints (the joining portions 53) between the small EL substrates 1a to 1d by capillary phenomenon, and from causing electrical short to other conductive portions. Further, the bank portion is intended to prevent the conductive material 6 from being insufficiently loaded between the wiring lines.

In the driving TFT 123, since the gate electrode 123b is formed on a semiconductor layer 123a, the gate electrode 123b is connected to the switching element 112 and the storage capacitor 113 via the wiring line (not shown), as shown in FIG. 1. Further, as shown in FIG. 3, a drain electrode in the semiconductor layer 123a is connected to the pixel electrode 23.

The organic EL elements are formed on the respective pixel electrodes 23. In the present exemplary embodiment, the organic EL elements include red organic EL elements R which emit red, green organic EL elements G which emit green, and blue organic EL elements B which emit blue. The organic EL elements R, G, and B each have a pixel electrode 23 serving as an anode, a hole injecting layer 70 to inject and transport holes from the pixel electrode 23, a light emitting layer 60 made of an organic EL material, and the cathode 50, which are sequentially formed. In the present exemplary embodiment, the hole injecting layer 70 and the light emitting layer 60 constitute a functional layer. Based on this construction, the respective organic EL elements R, G, and B perform light emission of red, green, or blue when the holes injected from the hole injecting layer 70 and electrons transported from the cathode 50 are coupled in the light emitting layer 60.

In the bottom-emission type organic EL device of the present exemplary embodiment, the pixel electrode 23 serving as the anode is made of a transparent conductive material. As the transparent conductive material, ITO is suitably used, but, other than ITO, for example, indium zinc oxide (IZO®) (a registered trademark of Idemitsu Kosan Kabushiki Kaisha Corporation)-based amorphous transparent conductive film may be used. In the present exemplary embodiment, ITO is used. Further, in case of the top-emission type organic EL device, it is not necessary to adopt a material having light transmittance particularly. For example, Al to be provided on a lower layer side of ITO may be used as a reflecting layer.

As a material to form the hole injecting layer 70, in particular, a dispersing solution of 3,4-polyethylenedioxythiophene/polystyrenesulfonic acid (PEDOT/PSS) [Product Name; Bytron-P: produced by Bayer Corporation], that is, a dispersing solution in which 3,4-polyethylenedioxythiophene is dispersed into polystyrenesulfonic acid as a dispersing solvent and this solution is dispersed into water may be used.

Moreover, a material to form the hole injecting layer 70 is not limited to the above-mentioned materials, but various materials may be used. For example, a material obtained by dispersing polystyrene, polypyrrole, polyaniline, polyacetylene, or its derivative in a suitable dispersing solvent, such as polystyrenesulfonic acid, may be used.

As a material to form the light emitting layer 60, well-known materials capable of emitting fluorescent light or phosphorescent light may be used. Further, in the present exemplary embodiment, in order to display full color, light emitting wavelength bands are respectively formed to correspond to the three primary colors of light. That is, the light emitting layer 60 having the light emitting wavelength band corresponding to red, the light emitting layer 60 having the light emitting wavelength band corresponding to green, and the light emitting layer 60 having the light emitting wavelength band corresponding to blue constitute one pixel, and then the light emitting layers 60 are degraded to emit light, such that the organic EL device 1 performs full color display as a whole.

As the material to form the light emitting layer 60, specifically, for example, (poly) fluorene derivative (PF), (poly) paraphenylenevinylene derivative (PPV), polyphenylene derivative (PP), polyparaphenylene derivative (PPP), polyvinylcarbazole (PVK), polythiophene derivative, or a polysilane-based material, such as polymethylphenylsilane (PMPS), may be used. Further, the light emitting layer may also be made of materials in which, into these polymer materials, high molecular materials, such as perylene-based pigment, coumalin-based pigment, or rhodamine-based pigment, or low molecular materials, such as rubrene, perylene, 9,10-diphenylanthracene, tetraphenylbutadiene, Nile red, coumalin 6 or quinacridone are doped.

The cathode 50 is formed to have an area wider than the total area of the actual display region 4 and the dummy region 5, and to cover them. As a material to form the cathode 50, a metallic material having low work function, such as Ca, Sr, or Ba, is suitably used. Further, Al may be deposited thereon to enhance or improve conductivity. In this case, Al may function as a reflecting film. Moreover, these materials are just an example of a material for the cathode 50, and well-known electrode materials other than the above-mentioned materials may be used.

Moreover, in the case in which the organic EL device 1 is the top-emission type organic EL device, the cathode 50 is made of Al having sufficiently thin thickness to exhibit light transmittance, or it may be made of a conductive material, such as ITO having light transmittance.

Further, on the circuit portion 11, partitions 85 to isolate the organic EL elements R, G, and B from each other are provided. That is, the surface of an interlayer insulating layer 95 on which the pixel electrode 23 is formed is covered with the pixel electrode 23, an inorganic bank layer 81 mainly containing a lyophilic material, such as SiO.sub.2, and an organic bank layer 82 made of acryl or polyimide. The partition 85 includes the inorganic bank layer 81 and the organic bank layer 82. Then, on the pixel electrode 23 in the pixel region (not shown) surrounded by the partition 85, the functional layer 110 having the hole injecting layer 70 and the light emitting layer 60 is formed sequentially, and the cathode 50 is formed to cover the light emitting layer 60 and the partition 85. Accordingly, the organic EL elements R, G, and B are respectively formed.

Here, the joining portion 53 of the small EL substrates 1a and 1b is located at the position at which the partition 85 is formed. That is, for example, the end portions 103a of the power lines 103 are located just below a partition portion 85b which is constructed by opposing partition half portions 85a formed on joining side end portions of the small EL substrates 1a and 1b each other. Thus, the end portions 103a of the power lines 103 can be exposed on the substrate 20. Therefore, as described below, by selectively arranging the conductive material 6 in that portion with the liquid droplet ejection method, the wiring lines (for example, between the power lines 103) are electrically connected.

Further, in such a manner, on the circuit portion 11, the partition 85 and the partition portion 85b are formed, and in the pixel regions surrounded by the partitions (the partition portion 85b), the organic EL elements R, G, and B are respectively formed. And then, a sealing portion 40 is formed to cover the cathode 50, such that the organic EL device 1 of an exemplary embodiment of the present invention is formed.

The sealing portion 40 may be made of sealing resin. Alternatively, an electrical insulating sealing substrate made of sealing resin may be provided. As sealing resin, for example, thermosetting resin or ultraviolet hardening resin may be included. In particular, epoxy resin, which is a kind of thermosetting resin, is preferable.

Next, based on the manufacturing method of such an organic EL device 1, an exemplary embodiment of a manufacturing method of the organic EL device 1 according to an exemplary embodiment of the present invention will be described. First, the small EL substrates 1a, 1b, 1c, and 1d are prepared. In regard to the small EL substrates 1a, 1b, 1c and 1d, for example, a substrate on which the elements up to the circuit portion 11 is formed or a substrate on which the partition 85 having the inorganic bank 81 and the organic bank 82 on the circuit portion 11 is further formed may be used. In the present exemplary embodiment, a substrate on which the elements up to the partition 85 are formed may be used. Further, in particular, in regard to the wiring lines electrically connected between the substrates 1a, 1b, 1c, and 1d (in the present exemplary embodiment, all of the scanning lines 101, the signal lines 102, and the power lines 103 may be respectively connected), the end portions at the side of the joining portions may be exposed on the substrates 1a, 1b, 1c, and 1d.

Here, in the present exemplary embodiment, all of the scanning lines 101, the signal lines 102, and the power lines 103 may be respectively connected. Specifically, among the wiring lines, the signal lines 102 and the power lines 103 may be arranged parallel to each other and then are formed in the same layer. Thus, the signal lines 102 and the power lines 103 are exposed on the same layer. Further, as regards the scanning lines 101, if the scanning lines 101 are formed to cross over the signal lines 102 or the power lines 103 via an insulating layer at positions crossing the signal lines 102 or the power lines 103, the scanning lines 101 may also be exposed on the same layer as that of the signal lines 102 or the power lines 103.

After preparing the small EL substrates 1a, 1b, 1c, and 1d, the substrates may be located on and bonded to the mother substrate 55. In this regard, for the bonding onto the mother substrate 55, for example, a transmissive adhesive may be used. Here, the locating of the respective small EL substrates 1a, 1b, 1c, and 1d may be performed such that the end portions of the wiring lines to be connected are opposite to each other. If doing so, as shown in FIG. 3, for example, the end portions 103a of the power lines 103 are opposite to each other and are shoved against each other. Moreover, the shoved portions of the end portions 103a face each other between the adjacent partition half portions 85a.

In this exemplary embodiment, the respective small EL substrates 1a, 1b, 1c, and 1d may be located on and bonded to the mother substrate 55. Before arranging the conductive material 6 on the end portions 103a of the wiring lines (the power lines 103), at both sides of the position at which the conductive material 6 is arranged to connect the wiring lines, the bank portions 8 are formed, as shown in FIG. 4. The bank portion 8 may be made of an organic insulating material, similar to the organic bank layer 82. In the present exemplary embodiment, in particular, as the organic insulating material, a liquid material may be used. Further, the bank portions 8 may be formed with the liquid droplet ejection method, such as an ink jet method or a dispenser method.

Figure 5A:
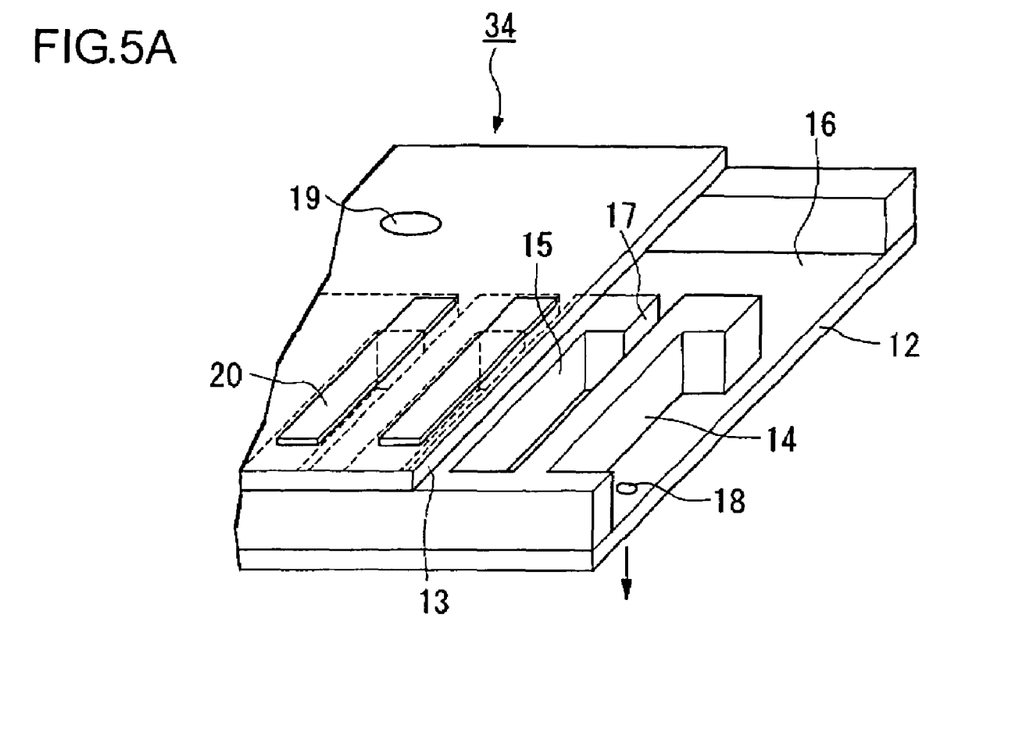
FIGS. 5A and 5B are schematics illustrating an ejection head in an exemplary embodiment of the present invention.
Figure 5B:
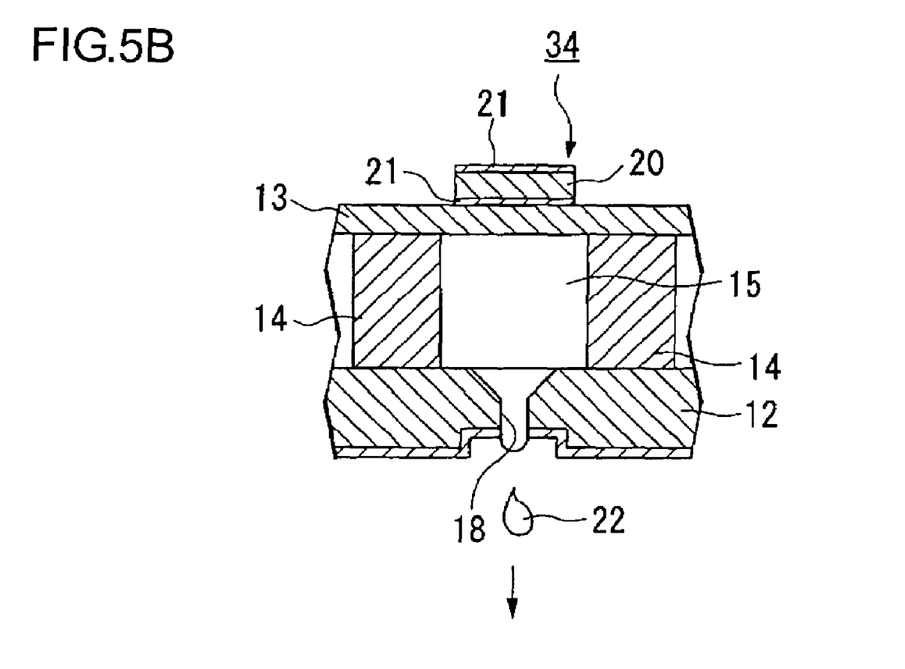

Here, the ink jet method, as the liquid droplet ejection method, is a method of ejecting liquid droplets at a desired position, for example, using an ejection head 34, as shown in FIGS. 5A and 5B.

The ejection head 34 has a stainless nozzle plate 12 and a vibration plate 13 which may be joined through a dividing member (reservoir plate) 14, for example, as shown in FIG. 5A. Between the nozzle plate 12 and the vibration plate 13, a plurality of cavities 15 and a reservoir 16 may be formed by the dividing member 14. The cavities 15 and the reservoir 16 may be connected to each other via a flow passage 17.

The insides of the respective cavities 15 and the reservoir 16 may be filled with a liquid material, and the flow passage 17 between them functions as a supply slot to supply the liquid material from the reservoir 16 to the cavities 15. Further, in the nozzle plate 12, a plurality of hole-shaped nozzles 18 to jet the liquid material from the cavities 15 may be formed in all directions. Meanwhile, in the vibration plate 13, a hole 19 may be formed to open the reservoir 16, and a liquid material tank (not shown) in an inkjet device may be connected to the hole 19 via a tube (not shown).

Further, on a surface opposite to the surface of the vibration plate 13 toward the cavities 50, as shown in FIG. 5B, piezoelectric elements 20 may be joined. The respective piezoelectric elements 20 may be interposed between a pair of electrodes and may be flexed to protrude outside at the time of application of an electric current. The piezoelectric element 20 may function as an ejecting device in exemplary embodiments.

Based on such a construction, the vibration plate 13 to which the piezoelectric element 20 is joined and integrated is flexed simultaneously with the piezoelectric element 20, such that the volume of the cavity 15 increases. In doing so, in the case in which the insides of the cavity 15 and the reservoir 16 are connected to each other and the inside of the reservoir 16 is filled with the liquid material, the liquid material corresponding to the increased volume in the cavity 15 may be induced from the reservoir 16 via the flow passage 17. Then, in such a state, if the application of the electrical current to the piezoelectric element 20 is released, the piezoelectric element 20 and the vibration plate 13 are returned to an original shape together. Then, since the cavity 15 also is returned to an original volume, a pressure of the liquid material inside the cavity 15 may increase, and then the liquid droplet 22 of the liquid material is ejected from the nozzle 18.

As the ejecting device of the ejection head, one other than an electromechanical converting body using the piezoelectric element 20 may be used. For example, a method in which an electrothermal converting body is used as an energy generating element, a charge control type or compressed vibration type continuous method, an electrostatic absorption method, or a method in which a liquid material is ejected by means of heating reaction caused by the irradiation of electromagnetic waves by a laser may be adopted.

By the ink jet method (the liquid droplet ejection method) using the ejection head 34, as shown in FIG. 4, after the liquid insulating material is arranged at both sides of the position at which the conductive material 6 is arranged between the wiring lines (the end portions 103a) to be connected, the material is dried and, if necessary, sintered, may be such that the bank portions 8 are formed.

Next, between the bank portions 8 formed in such a manner and on the wiring lines (the end portions 103a), the conductive material 6 is arranged to electrically connect the corresponding wiring lines (the scanning lines 101, the signal lines 102, or the power lines 103). When such a conductive material 6 is arranged, similar to the bank portions 8, the liquid droplet ejection method, such as the ink jet method or the dispenser method, is also adopted. In this case, as the conductive material 6, a liquid-adjusted material, such as a colloid solution containing conductive fine particles such as silver or gold, is suitably used.

As shown in FIG. 4, after such a liquid conductive material 6 is selectively arranged between the wiring lines (the end portions 103a) to be connected and between the bank portions 8 with the ink jet method (the liquid droplet ejection method), the material is dried and, if necessary, sintered, such that the conductive material 6 is solidified. Accordingly, the connection between the wiring lines is completed. Moreover, the electrical connection between wiring lines is performed with respect to all the scanning lines 101, the signal line 102, and the power lines 103.

Next, on the conductive material 6 formed between the wiring lines, the insulating material 7 is arranged to cover it, and thus the wiring lines may be prevented from being electrically shorted to other conductive portions (for example, the cathode 50). In an exemplary embodiment, the arrangement of the insulating material 7 may be performed by the liquid droplet ejection method, similar to the bank portions 8 or the conductive material 6.

In such a manner, after performing the connection of the wiring lines between the respective small EL substrates 1a, 1b, 1c, and 1d, similar to the prior art, the hole injecting layer 70 is formed in the pixel region surrounded by the partition 80, and further the light emitting layer 60 is formed thereon. Moreover, as regards the formation of the hole injecting layer 70 and the light emitting layer 60, the ink jet method (the liquid droplet ejection method) is suitably adopted. Then, the cathode 50 is formed to cover the light emitting layer 60 and the partition 80 with a vapor deposition method, and further the sealing portion 40 is formed to cover the cathode 50, such that the organic EL device 1 is obtained.

In the manufacturing method of such an organic EL device 1, since the corresponding wiring lines in the small EL substrates 1a, 1b, 1c, and 1d are connected to each other by means of the conductive material 6, in the resultant organic EL device 1, potential inclination may be generated in the respective wiring lines (the scanning lines 101, the signal lines 102, or the power lines 103) by wiring line resistance. Thus, even when display irregularity is generated, display irregularity may only be consecutively generated by means of potential inclination. Further, in the joining portions (joints) 53 between the small EL substrates 1a, 1b, 1c, and 1d, display irregularity (display difference) may only be generated consecutively, not inconsecutively. Therefore, since display irregularity (display difference) almost never meets the eye of an observer, display characteristics of the organic EL device 1 are improved.

Further, since the conductive material 6 and the insulating material 7 covering the conductive material 6 are provided on the end portions of the wiring lines by the liquid droplet ejection method, the conductive material 6 and the insulating material 7 are easily arranged in a predetermined amount at desired positions. In addition, at both sides of the position at which the conductive material 6 may be arranged, the insulating material may be arranged by means of the liquid droplet ejection method, and the bank portions 8 made of the insulating material may be formed. Thus, it is possible to prevent or discourage the conductive material 6 from flowing in both sides of the position at which the conductive material is arranged, from being penetrated into the joints (the joining portions 53) between the small EL substrates 1a, 1b, 1c, and 1d by capillary phenomenon, and from causing or contributing to electrical short to other conductive portions. Further, it is possible to prevent the conductive material 6 from being insufficiently loaded between the wiring lines.

Further, in the organic EL device 1 obtained by such a manufacturing method, as described above, since the corresponding wiring lines between the small EL substrates 1a, 1b, 1c, and 1d are electrically connected to each other by the conductive material 6, in the joining portions (joints) 53 between the small EL substrates 1a, 1b, 1c, and 1d, display irregularity (display difference) may only be consecutively generated, not inconsecutively. Therefore, since display irregularity (display difference) almost never meets the eye of an observer, display characteristics of the organic EL device 1 may be enhanced or improved.

Moreover, the exemplary embodiments of the present invention may not be limited to the above-described exemplary embodiments, but various modifications are possible without departing from a subject matter of the present invention. For example, in the above-described exemplary embodiments, the wiring lines of the driving element (the switching TFT 112 and the driving TFT 123), all the scanning lines 101, the signal lines 102, and the power lines 103 may be electrically connected to each other with the conductive material 6. However, in another exemplary embodiment of the present invention, at least one of these wiring lines are connected to each other with the conductive material 6. In this case, according to the exemplary embodiments, display characteristics can be enhanced or improved.

Further, the organic EL device of the exemplary embodiments of the present invention may have a large-sized EL substrate in which the respective small EL substrates are connected in its surface direction. Here, the term "large-sized" is not intended to specifically limit the size of the substrate. This means that the small EL substrate as a unit may be plurally collected. Therefore, even though a substrate forms a small screen, generally speaking, if it is constructed by plurally collecting the small EL substrate as a unit, it can be referred to as "large-sized".

Figure 6:
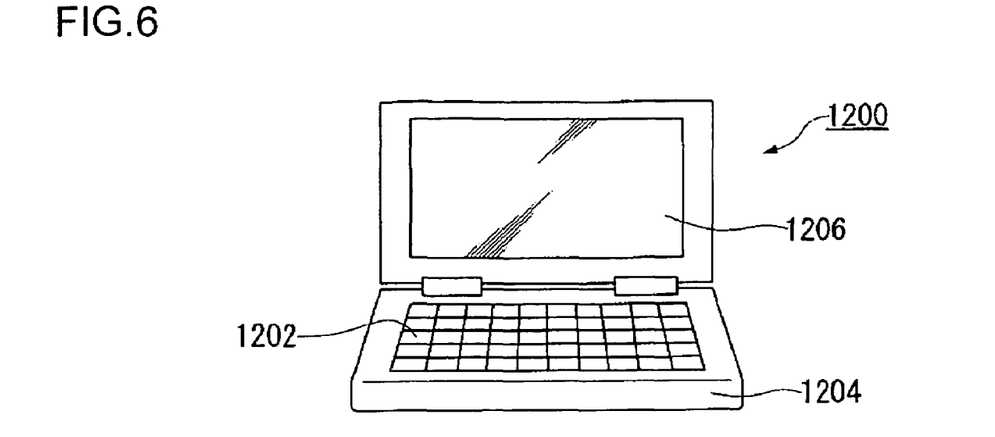
FIG. 6 is a perspective schematic showing an electronic apparatus in an exemplary embodiment of the present invention.

Next, an electronic apparatus of an exemplary embodiment of the present invention will be described. The electronic apparatus in exemplary embodiments may be an electronic apparatus having the organic EL device 1 as a display unit, in the electronic apparatus of FIG. 6. FIG. 6 is a perspective schematic showing an example of a portable information processing device, such as a word processor or a personal computer, for example. In FIG. 6, reference numeral "1200" denotes an information processing device, reference numeral "1202" denotes an input unit, such as a keyboard, reference numeral "1204" denotes an information processing device main body, and reference numeral "1206" denotes a display unit using the organic EL device 1. According to this electronic apparatus, since this electronic apparatus includes the organic EL device 1, of which display characteristics are improved, as the display unit, display characteristics of the electronic apparatus itself may be enhanced or improved.

What is claimed is:

1. An organic electroluminescent device, comprising:
    electrodes opposite to each other;
    organic electroluminescent elements provided between the electrodes, each organic electroluminescent element including a functional layer having at least a light emitting layer, and driving elements to drive the organic electroluminescent elements;
    a plurality of small electroluminescent substrates, the organic electroluminescent elements and the driving elements being formed on each of the plurality of small electroluminescent substrates, the plurality of small electroluminescent substrates being connected to each other in a surface direction to form a large electroluminescent substrate;
    a plurality of partitions formed between the small electroluminescent substrates;
    wiring lines of the driving elements respectively formed on the plurality of small electroluminescent substrates, and below the plurality of partitions, in at least one kind of wiring lines among wiring lines, corresponding wiring lines between the connected plurality of small electroluminescent substrates being electrically connected to each other by a conductive material, the conductive material being formed below the plurality of partitions, in a plurality of joining portions between the small electroluminescent substrates.

2. The organic electroluminescent device according to claim 1, further comprising:
    power lines in the power lines among the wiring lines of the driving elements, the corresponding wiring lines between the connected plurality of small electroluminescent substrates being electrically connected to each other by the conductive material.

3. The organic EL device according to claim 1, further comprising:
    scanning lines or signal lines among the wiring lines of the driving elements, in the scanning lines or the signal lines, corresponding wiring lines between the connected plurality of electroluminescent substrates being electrically connected to each other by the conductive material.

4. The organic electroluminescent device according to claim 1 further comprising:
    an insulating material formed on the conductive material to cover the conductive material.

5. The organic electroluminescent device according to claim 1 further comprising:
    bank portions made of an insulating material formed at both sides of a position at which the conductive material is formed on the wiring lines connected by the conductive material.

6. A method of manufacturing an organic electroluminescent device in which a plurality of small electroluminescent substrates are connected to each other in a surface direction to form a large electroluminescent substrate, each of the plurality of small electroluminescent substrates including electrodes opposite to each other, a plurality of partitions formed between the small electroluminescent substrates, organic electroluminescent elements provided between the electrodes, each organic electroluminescent element including a functional layer having at least a light emitting layer, and driving elements to drive the organic electroluminescent elements, the method comprising:
    exposing end portions of at least one kind of wiring lines among wiring lines of the driving elements formed respectively on the plurality of small electroluminescent substrates;
    connecting the small electroluminescent substrates to each other such that the exposed end portions are opposite to each other;
    forming a plurality of partitions between the small electroluminescent substrates;
    arranging a conductive material between the end portions of opposing wiring lines, the wiring lines being formed below the plurality of partitions, to electrically connect the wiring lines to each other by the conductive material, formed below the plurality of partitions, in a plurality of joining portions between the small electroluminescent substrates.

7. The method of manufacturing the organic electroluminescent device according to claim 6, further comprising:

arranging the conductive material between the end portions of the wiring lines by a liquid droplet ejection method.

8. The method of manufacturing the organic electroluminescent device according to claim 6, further comprising:
providing an insulating material on the conductive material to cover the conductive material by the liquid droplet ejection method, after arranging the conductive material between the end portions of the wiring lines to electrically connect the wiring lines to each other by the conductive material.

9. The method of manufacturing the organic electroluminescent device according to claim 6, further comprising:
arranging an insulating material at both sides of a position at which the conductive material is formed on the wiring lines to be connected by a liquid droplet ejection method to form bank portions made of the insulating material, arranging the insulating material after connecting the plurality of small electroluminescent substrates to each other such that exposed end portions of power lines are opposite to each other, and before arranging the conductive material between the opposing end portions of the wiring lines.

10. An electronic apparatus, comprising:
the organic electroluminescent device according to claim 1.

11. An electronic apparatus, comprising:
an organic electroluminescent device manufactured by the manufacturing method according to claim 6.

* * * * *